(12) United States Patent
Cheng et al.

(10) Patent No.: US 6,583,201 B2
(45) Date of Patent: Jun. 24, 2003

(54) CONDUCTIVE MATERIALS WITH ELECTRICAL STABILITY FOR USE IN ELECTRONICS DEVICES

(75) Inventors: Chih-Min Cheng, Lowell, MA (US); Gerry Fredrickson, Westford, MA (US); Girish Hanchinamani, Lowell, MA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/841,980

(22) Filed: Apr. 25, 2001

(65) Prior Publication Data

US 2002/0193467 A1 Dec. 19, 2002

(51) Int. Cl.[7] .................................................. C08K 5/00
(52) U.S. Cl. ...................... 523/457; 252/512; 252/513; 252/514; 252/515; 523/458; 523/459
(58) Field of Search ................................. 252/512, 513, 252/514, 515; 523/457, 458, 459

(56) References Cited

U.S. PATENT DOCUMENTS

| | | | |
|---|---|---|---|
| 4,282,111 A | 8/1981 | Ciuba | |
| 4,512,909 A | 4/1985 | Schiessl | |
| 4,569,783 A | 2/1986 | Muccitelli | |
| 4,687,597 A | 8/1987 | Siuta | |
| 5,336,303 A | 8/1994 | Cocks | |
| 5,376,403 A | 12/1994 | Capote et al. | |
| 5,463,190 A | 10/1995 | Carson et al. | |
| 5,542,602 A | 8/1996 | Gaynes et al. | |
| 5,713,508 A | 2/1998 | Gaynes et al. | |
| 5,716,663 A | 2/1998 | Capote et al. | |
| 5,830,389 A | 11/1998 | Capote et al. | |
| 5,853,622 A | 12/1998 | Gallagher et al. | |
| 5,922,397 A | 7/1999 | Brandt et al. | |
| 5,948,533 A | 9/1999 | Gallagher et al. | |
| 5,951,918 A | 9/1999 | Kuwajima et al. | |
| 6,344,157 B1 | 2/2002 | Cheng et al. | |

FOREIGN PATENT DOCUMENTS

| | | | |
|---|---|---|---|
| DE | 226000 | * | 8/1985 |
| EP | 343712 | | 11/1989 |
| EP | 400642 | | 5/1990 |
| EP | 470262 | | 2/1992 |
| EP | 567275 | | 10/1993 |
| EP | 1 032 038 A2 | | 8/2000 |
| JP | 55160072 A | | 5/1979 |
| JP | 57113505 A | | 1/1981 |
| JP | 2001006438 | | 1/2001 |

OTHER PUBLICATIONS

Stepanenko, *Mashinostr.* (1966), (12) pp 105–108.*
Lynch et al., Corrosion/82, Intern. Corrosion Forum, pp 21.1–21.12, 1982.*
Hitachi, Abstract of JP6338219, 1994.*
Lida et al., Abstract of JP1018600, 1989.*
Singh, M. M. et al.: "Inhibition of Copper Corrosion in Aqueous Sodium Chloride Solution by Various Forms of the Piperidine Moiety"; 789 Corrision 50(1994)Aug., No. 8, Houston, TX.
Abdel–Aal, M. S. et al.: "Inhibiting and accelerating effects of some quinolines on the corrosion of and some binary zinc zinc alloys in HCl solution"; Journal of Applied Electrochemistry 22 (1992) 1104–1109.
Lu, Daoqiang: "Isotropic Conductive Adhesives Filled with Low–Melting–Point Alloy Fillers"; IEEE Transactions on Electronics Packaging Manufacturing, vol. 23, No. 3, Jul. 2000.
Lu, Daoqiang: "Development of Conductive Adhesives Filled with Low–Melting–Point Alloy Fillers"; 2000 Inter. Symposium on Advanced Packaging Materials Jul., 2000.
Wong, C. P.: "Recent Advances on Electrically Conductive Adhesives for Electronics Applications"; 2000 IEEE, Jul., 2000.

* cited by examiner

*Primary Examiner*—Robert Dawson
*Assistant Examiner*—D. Aylward
(74) *Attorney, Agent, or Firm*—Charles W. Almer

(57) ABSTRACT

An composition with improved electrical stability for use in microelectronic applications comprises a polymeric resin, a conductive filler, a curing agent, optionally either a reactive or a nonreactive diluent and a corrosion inhibitor to provide the electrical stability.

24 Claims, No Drawings

CONDUCTIVE MATERIALS WITH ELECTRICAL STABILITY FOR USE IN ELECTRONICS DEVICES

FIELD OF THE INVENTION

This invention relates to compositions that are suitable for use as conductive materials in microelectronic devices or semiconductor packages to provide electrically stable interconnections.

BACKGROUND OF THE INVENTION

Conductive compositions are used for a variety of purposes in the fabrication and assembly of semiconductor packages and microelectronic devices. For example, conductive adhesives are used to bond integrated circuit chips to substrates (die attach adhesives) or circuit assemblies to printed wire boards (surface mount conductive adhesives).

Two conductors with dissimilar electrochemical potentials will form an electrochemical cell in the presence of water. The conductors act as cathode and anode, and environmental humidity provides the necessary aqueous medium to bridge the anode and cathode. The metal with the lower electrochemical potential acts as the anode resulting in the loss of electrons $\{M-ne \to M^{n+}\}$ and the corrosion of the metal. The metal with the higher electrochemical potential acts as the cathode $\{2H_2O+O_2+4e \to 4OH^-\}$. Oxygen is involved in this mechanism but does not directly react with the anode metal. The metal ion $M^{n+}$ will combine with $OH^-$ and form a metal hydroxide that stabilizes by developing into a metal oxide, which over time forms on the anode surface. Metal oxides in general are non-conductive, the result being a decrease in conductivity of the metal circuitry.

The problem is less acute when the filler in the composition is the same metal as the contiguous circuitry or the substrate. Thus, a semiconductor package using a conductive composition, one comprising an epoxy resin and silver filler, for example, will not be as susceptible to electrochemical failure when a silver-filled composition is used on a silver substrate. However, if the composition is used on a nickel plated substrate, electrochemical corrosion will result under high humidity conditions.

These compositions, however, are vulnerable to environmental conditions, and high temperature and high humidity can cause the electrical resistance of the assembly fabricated with these compositions to increase substantially over time. The suspected mode of failure is electrochemical corrosion of the circuitry at the interface of the conductive filler in the composition with another contiguous metal surface, for example, a metal lead frame or other circuitry.

It would be an advantage, therefore, to provide conductive materials that form electrically stable assemblies for use in semiconductor packaging operations. It would also be advantageous to provide a conductive adhesive which would combine a corrosion inhibitor in a manner that would provide improved contact resistance when exposed to harsh environmental conditions.

SUMMARY OF THE INVENTION

This invention is a composition that comprises a polymeric resin, a conductive filler, one or more corrosion inhibitors, a curing agent/catalyst, an adhesion promoter and optionally other additives such as reactive or nonreactive diluents. The compositions exhibit improved electrical stability over those compositions that do not contain a corrosion inhibitor. The corrosion inhibitors will be present in an amount of no more than 10 weight percent (but not 0%); the resin will be present in an amount of 10 to 90 weight percent; the filler in an amount of about 1 to 90 weight percent; the curing agent will be present in a ratio of curing agent to resin in amount of no more than 1:1, the adhesion promoters in an amount of no more than 10 weight percent, for a total of 100 weight percent.

In a further embodiment, the composition includes N-Hydroxysuccinimide in combination with one or more corrosion inhibitors.

DETAILED DESCRIPTION OF THE INVENTION

Chemical compositions that may be used in the fabrication of semiconductor packages can be given improved electrical stability by the addition of an oxygen scavenger or corrosion inhibitor or both to the formulation. Although oxygen scavengers and corrosion inhibitors have been used in aqueous medium to inhibit corrosion, it was unexpected that these materials could be added to compositions for use in the electronics industry without any loss in initial conductivity or adhesion properties of these compositions.

A conductive composition achieves its conductivity through metal particles dispersed throughout the composition. When these metal particles are in contact with another contiguous metal, as is required to form the circuitry for the ultimate electronic device, and water is present, an electrochemical cell is formed. The reaction at the cathode utilizes oxygen, and the reaction at the anode eventually produces a metal oxide.

To counteract the formation of metal oxide, corrosion inhibitors are commonly utilized. A corrosion inhibitor is defined herein to be any chemical compound that has a lone pair of electrons, such as nitrogen-, sulfur-, and oxygen-containing compounds, that will bind with metal and impede the reactivity of the metal at the electrochemical anode. Exemplary corrosion inhibitors are 1,10-phenathiodine, phenothiazine, benzotriazole, benzimidazole, mercaptobenzothiazole, dicyandiamide, 3-isoprolyamino-1-butyne, propargyl quinolinium bromide, 3-benzylamino-1-butyne, dipropargl ether, dipropargyl thioether, propargyl caproate, dianimoheptane, phenathroline, amine, diamine, triamine, hexamethyleneimide, decamethyleneimide, hexamethyleneiminebenzoate, hexamethyleneimine-3,5-dinitrobenzoate, hexamethylenetetramin, d-oximino-b-vinyl quinuclidine, aniline, 6-N-ethyl purine, 1-ethylamino-2-octadecylimidazoline, morpholine, ethanolamine, aminophenol, 2-hydroxyquinoline, 6-hydroxyquinoline, 8-hydroxyquinoline, pyridine and its derivatives, quinoline and its derivatives, acridine, imidazole and its derivatives, toluidine, mercaptan, thiophenol and its derivates, sulfide, sulfoxide, thiophosphate, thiourea and piperidine.

Exemplary resins for use in these formulations are any of the resins currently used throughout the industry, such as, vinyl, acrylic, phenolic, epoxy such as Bisphenol A, Bisphenol F, maleimide, polyimide, or silicon-containing resins. The formulations and physical properties are known to those skilled in the art.

Exemplary curing agents or catalysts are liquid imidazole and solid tertiary amines.

Exemplary reactive diluents are glycidyl ethers, for example, 1,4-butanediol diglycidyl ether; vinyl ethers, for example, ethylene vinyl ether, and vinyl esters, for example, ethylene vinyl ester, and acrylates, for example, methyl methacrylate.

An exemplary nonreactive diluent is butyl carbitol.

Exemplary adhesion promoters are silanes and polyvinyl butyrol.

Chemical compositions are used in the fabrication of electronic packages, for example, as adhesives, encapsulants, or to form integral passives, such as resistors or capacitors. By the judicious choice of filler, these compositions can be formulated to give a broad range of resistivity, conductivity, capacitance, or dielectric properties as needed for the specific circuit component. Providing the precise type and amount of filler for obtaining the electrical properties desired for a specific end use application is within the expertise of one skilled in the art. It will be understood that all resistors necessarily exhibit some conductance, and all conductors exhibit some resistance, and that resistors and conductors form a continuum of resistance and conductance depending on the specific property of the individual material. This continuum is also the case for dielectrics and capacitors.

Exemplary conductive fillers are silver, copper, gold, palladium, platinum, carbon black, carbon fiber, graphite, aluminum, indium tin oxide, silver coated copper, silver coated aluminum, metallic coated glass spheres, silver coated fiber, silver coated spheres and antimony doped tin oxide.

In another embodiment, this invention is a method of enhancing the electrical stability of a conductive composition comprising adding to the composition a corrosion inhibitor.

Applicants have discovered that an adhesive comprising a quinoline derivative, such as 8-hydroxyquinoline, 6-hydroxyquinoline and 2-hydroxyquinoline, as a corrosion inhibitor compound to chelate or react with the metal anode or cathode will reduce or prevent the electrochemical process and prevent significant increases in resistivity.

The adhesive composition of this embodiment of the invention contains up to about 10 weight percent (but not 0%) of a quinoline derivative corrosion inhibitor or piperidene; about 10 to 90 weight percent of a resin; about 10 to 90 weight percent of a conductive filler; about 0 to 10 weight percent of adhesion promoters (but not 0%); curing agent in a ratio of curing agent to resin of up to about 1:1 (but not 0); and optionally about 0 to 50 weight percent of a diluent for a total of 100 weight percent. Preferably, the quinoline derivative or piperidene is present in the range of about 0.9 to 2 weight percent, the resin is present in the range of about 18 to 22 weight percent, the curing agent is present in the range of about 3 to 4 weight percent, the conductive filler is present in the range of about 70 to 80 weight percent and the adhesion promoter is present in the range of 0 to 1 weight percent (but not 0%). Preferred quinoline derivatives include 8-hydroxyquinoline, 6-hydroxyquinoline and 2-hydroxyquinoline. In a preferred embodiment, the conductive material contains a corrosion inhibitor comprising either 6-hydroxyquinoline or 2-hydroxyquinoline. In a further preferred embodiment, up to 2 weight percent 8-hydroxyquinoline is utilized as the corrosion inhibitor in combination with less than 1 weight percent of N-Hydroxysuccinimide. In a still further preferred embodiment, up to 1 weight percent 8-hydroxyquinoline is utilized as the corrosion inhibitor in combination with up to 1 weight percent of piperidene and up to 1 weight percent of N-Hydroxysuccinimide.

The invention can be further described by the following examples.

EXAMPLES

Example 1

Nine compositions were prepared using between 18 to 22 weight percent epoxy resin, 3 to 4 weight percent solid and liquid curing agents, about 75% silver, about 0.9 to 2 weight percent corrosion inhibitor and less than 1 weight percent of an adhesion promoter. The compositions were prepared by mixing the resin, solid curing agent and corrosion inhibitor or mixture of corrosion inhibitors (except for composition A) with a three roll mill. Next, the liquid curing agent or catalyst and the adhesion promoter were added to the mixture in a double pranatory mixer. Once the composition reached a homogeneous state the conductive filler was added. Finally, the entire composition was mixed and de-aired. The resulting composition is a pasty material that may be either syringe dispensed or screen printed.

The compositions were measured for the effects of temperature and humidity on resistivity when contacted with a contiguous metal, denominated contact resistivity. The contact resistivity test vehicle consisted of a FR4 board substrate on which was printed a pattern of an open circuit with metal segments 3 mm long separated by 1 mm gaps in a horseshoe shape. Horseshoe circuits are breached with ten zero ohm resistors. The number of connections between the composition and the metal segments is ten. The compositions were cured for 10 minutes at 150° C.

By using multiple metal-adhesive connections in the contact resistance device, the conductivity change can be magnified and the experimental error minimized. Contact resistance was measured across the circuit using a Keithley 580 Microohm meter and was deemed to be the combination of the resistance as determined by resistivity plus interfacial resistance between the end of each metal segment and the test composition.

Contact resistance values were determined directly after cooling to room temperature after curing, and monitored over the course up to 1800 hours while being subjected to 85° C. and 85% relative humidity. The samples were returned to room temperature and measurements were recorded at that time.

The percent increase in contact resistivity for compositions A, B, C and D are reported in Table 1 and show a significant improvement in the electrical stability of the compositions in the presence of 2-hydroxyquinoline (2HQL), 6-hydroxyquinoline (6HQL) or piperidene (PPD) as a corrosion inhibitor.

TABLE 1

Contact resistance stability of conductive adhesives with 6HQL, 2HQL and piperidene inhibitors

| Formula | Inhibitor, % | | | Resistivity change in 85 C./85% RH | | | | |
|---|---|---|---|---|---|---|---|---|
| | 6HQL | 2HQL | PPD | | | | | |
| A | 0 | 0 | 0 | Time, hrs | 0 | 90 | 420 | 852 |
| | | | | Ohm | 11 | 13.6 | 32.8 | 331.4 |
| | | | | % Change | 0 | 24 | 198 | 2913 |

TABLE 1-continued

Contact resistance stability of conductive adhesives with 6HQL, 2HQL and piperidene inhibitors

| Formula | Inhibitor, % | | | Resistivity change in 85 C./85% RH | | | | | |
| --- | --- | --- | --- | --- | --- | --- | --- | --- | --- |
| | 6HQL | 2HQL | PPD | | | | | | |
| B | 0.91 | 0 | 0 | Time, hrs | 0 | 120 | 576 | 912 | 1080 |
| | | | | Ohm | 23.6 | 22.6 | 24.4 | 23.3 | 23.7 |
| | | | | % Change | 0 | −4 | 3 | −1 | 0.4 |
| C | 0 | 0.91 | 0 | Time, hrs | 0 | 120 | 576 | 912 | 1080 |
| | | | | Ohm | 11.8 | 12.5 | 14.5 | 16.3 | 17.3 |
| | | | | % Change | 0 | 6 | 23 | 38 | 47 |
| D | 0 | 0 | 1.8 | Time, hrs | 0 | 120 | 457 | 624 | |
| | | | | Ohm | 14.1 | 14.7 | 20 | 23.4 | |
| | | | | % Change | 0 | 4 | 42 | 66 | |

Example 2

This example demonstrates the effect of one or more corrosion inhibitors in combination with 8-hydroxyquinoline. The samples were prepared in the same manner as those of Example 1 and were subjected to 85° C. and 85% relative humidity for a period up to 1900 hours. The results, shown in Table 2, indicate that compositions containing 8-hydroxyquinoline or a mixture of 8-hydroxyquinoline (8HQL) and piperidene as a corrosion inhibitor, and N-Hydroxysuccinimide (NHSI) provided superior electrical stability.

TABLE 2

Contact resistance stability of conductive adhesives with 8-hydroxyquinoline and various corrosion inhibitors

| Formula | Corrosion inhibitors, % | | | | Resistivity change in 85 C./85% RH | | | | |
| --- | --- | --- | --- | --- | --- | --- | --- | --- | --- |
| | 8HQL | 6HQL | NHSI | PPO | | | | | |
| A | 0 | 0 | 0 | 0 | Time, hrs | 0 | 90 | 420 | 852 |
| | | | | | Ohm | 11.0 | 13.6 | 32.8 | 331.4 |
| | | | | | % Change | 0 | 24 | 198 | 2913 |
| E | 1.8 | 0 | 0 | 0 | Time, hrs | 0 | 100 | 500 | 1000 |
| | | | | | Ohm | 15.6 | 17 | 16.4 | 24.3 |
| | | | | | % Change | 0 | 9 | 5 | 56 |
| F | 0 | 0 | 1.8 | 0 | Time, hrs | 0 | 168 | 1872 | |
| | | | | | Ohm | 13.6 | 21.7 | 143.7 | |
| | | | | | % Change | 0 | 60 | 957 | |
| D | 0 | 0 | 0 | 1.8 | Time, hrs | 0 | 120 | 456 | 624 |
| | | | | | Ohm | 14.1 | 14.7 | 20 | 23.4 |
| | | | | | % Change | 0 | 4 | 42 | 66 |
| G | 1.6 | 0 | 0.4 | 0 | Time, hrs | 0 | 120 | 460 | 624 |
| | | | | | Ohm | 8.9 | 9.4 | 9.9 | 10.1 |
| | | | | | % Change | 0 | 6 | 11 | 13 |
| H | 0.8 | 0 | 0.4 | 0.6 | Time, hrs | 0 | 168 | 1872 | |
| | | | | | Ohm | 10.5 | 11.5 | 16.2 | |
| | | | | | % Change | 0 | 10 | 54 | |
| I | 0 | 0.8 | 0.4 | 0.6 | Time, hrs | 0 | 168 | 1872 | |
| | | | | | Ohm | 20.2 | 23.2 | 51.6 | |
| | | | | | % Change | 0 | 15 | 155 | |

What is claimed is:

1. A composition for use in microelectronic devices comprising
   (a) a polymeric resin,
   (b) a conductive filler,
   (c) a corrosion inhibitor,
   (d) a curing agent or catalyst,
   (e) an adhesion promoter, and
   (f) optionally, a reactive or a nonreactive diluent
   wherein the corrosion inhibitor is selected from the group consisting of 6-hydroxyquinoline, 2-hydroxyquinoline or piperidene.

2. The composition according to claim 1 in which
   (a) the polymeric resin is present in an amount of about 10 to about 90 weight percent;
   (b) the conductive filler is present in an amount of about 10 to about 90 weight percent;
   (c) the corrosion inhibitor is present in an amount up to about 10 weight percent (but not 0%),
   (d) the curing agent or catalyst is present in an amount of a ratio of curing agent to resin of no greater than about 1:1 (but not 0); and
   (e) the adhesion promoter is present in an amount of about 0 to about 10 weight percent, and
   (f) the diluent is present in an amount of about 0 to about 50 weight percent
   for a total of 100 weight percent.

3. The composition according to claim 2 wherein the resin is present in an amount of from about 18 to about 22 weight percent.

4. The composition according to claim 2, wherein the curing agent is present in an amount of from about 3 to about 4 weight percent.

5. The composition according to claim 2, wherein the adhesion promoter is present in an amount of less than 1 weight percent.

6. The composition according to claim 2, wherein the corrosion inhibitor is present in an amount of from about 0.9 to about 2 weight percent.

7. The composition according to claim 2, wherein the conductive filler is present in an amount of about 75 weight percent.

8. The composition according to claim 1 in which the conductive filler is selected from the group consisting of silver, copper, gold, palladium, platinum, carbon black, carbon fiber, graphite, aluminum, indium tin oxide, silver coated copper, silver coated aluminum, metallic coated glass spheres, silver coated fiber, silver coated spheres, antimony doped tin oxide or mixtures thereof.

9. The composition according to claim 8, wherein the conductive filler is silver.

10. The composition according to claim 2 in which the resins are selected from the group consisting of Bisphenol A epoxy, Bisphenol F epoxy, vinyl-, acrylic-, phenol-, epoxy-, maleimide-, polyimide-, or silicon-containing resins.

11. The composition according to claim 10, wherein the resins are selected from the group of Bisphenol A or Bisphenol F epoxy resins.

12. A composition for use in microelectronic devices comprising
   (a) a polymeric resin,
   (b) a conductive filler,
   (c) a corrosion inhibitor,
   (d) a curing agent or catalyst, and
   (e) an adhesion promoter,
   (f) 8-hydroxyquinoline, and
   (g) optionally, a reactive or a nonreactive diluent,
      wherein the corrosion inhibitor is selected from the group consisting of N-Hydroxysuccinimide, piperidene or mixtures thereof.

13. The composition according to claim 12 in which
   (a) the polymeric resin is present in an amount of about 10 to about 90 weight percent;
   (b) the conductive filler is present in an amount of about 10 to about 90 weight percent;
   (c) the corrosion inhibitor is present in an amount up to about 10 weight percent (but not 0%),
   (d) the curing agent or catalyst is present in an amount of a ratio of curing agent to resin of no greater than about 1:1 (but not 0),
   (e) the adhesion promoters are present in an amount of about 0 to about 10 weight percent,
   (f) the 8-hydroxyquinoline is present in an amount of about 0 to about 10 weight percent (but not 0%),
   (g) the diluent is present in an amount of about 0 to about 50 weight percent;
      for a total of 100 weight percent.

14. The composition according to claim 13 wherein the resin is present in an amount of from about 18 to about 22 weight percent.

15. The composition according to claim 13, wherein the curing agent or catalyst is present in an amount of from about 3 to about 4 weight percent.

16. The composition according to claim 13, wherein the adhesion promoter is present in an amount of less than 1 weight percent.

17. The composition according to claim 13, wherein the corrosion inhibitor is present in an amount of from about 0.9 to about 2 weight percent.

18. The composition according to claim 13, wherein the conductive filler is present in an amount of about 75 weight percent.

19. The composition according to claim 13, wherein the N-Hydroxysuccinimide is present in an amount of about 0.5 weight percent.

20. The composition according to claim 13, wherein the piperidene is present in an amount of less than about 2 weight percent.

21. The composition according to claim 13 in which the conductive fillers are selected from the group consisting of silver, copper, gold, palladium, platinum, carbon black, carbon fiber, graphite, aluminum, indium tin oxide, silver coated copper, silver coated aluminum, metallic coated glass spheres, silver coated fibers, silver coated spheres and antimony doped tin oxide.

22. The composition according to claim 20, wherein the conductive filler is silver.

23. The composition according to claim 13 in which the resins are selected from the group consisting of Bisphenol A, epoxy, Bisphenol F epoxy, vinyl-, acrylic-, phenol-, epoxy-, maleimide-, polyimide-, or silicon-containing resins.

24. The composition according to claim 23, wherein the resins are selected from the group of Bisphenol A or Bisphenol F epoxy resins.

* * * * *